(12) United States Patent  
Costrini et al.

(10) Patent No.: US 6,319,840 B1  
(45) Date of Patent: Nov. 20, 2001

(54) FOR MOL INTEGRATION

(75) Inventors: Gregory Costrini, Hopewell Junction; Mihel Seitz, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,330

(22) Filed: Jun. 29, 2000

(51) Int. Cl.[7] .................... H01L 21/302; H01L 21/3065

(52) U.S. Cl. ................ 438/706; 438/712; 438/720; 438/721; 438/723; 438/724

(58) Field of Search .................... 438/689, 696, 438/697, 706, 723, 720, 724, 725, 721, 712

(56) References Cited

U.S. PATENT DOCUMENTS

| | | | |
|---|---|---|---|
| 5,670,404 | * | 9/1997 | Dai ........................................ 438/239 |
| 5,936,272 | * | 8/1999 | Lee ........................................ 257/306 |
| 6,214,743 | * | 4/2001 | Oiao ..................................... 438/723 |

* cited by examiner

*Primary Examiner*—Robert Kunemund  
*Assistant Examiner*—Lynette T. Umez-Eronini  
(74) *Attorney, Agent, or Firm*—Scully, Scott, Murphy & Presser; Daryl K. Neff, Esq

(57) ABSTRACT

A method of fabricating a semiconductor device in which the bitlines and the bitline contacts are fabricated utilizing a single masking step in which line-space resist patterns are employed in defining the regions for the bitlines and the bitline contacts. The method utilizes a first line-space resist pattern and a second line-space resist pattern which is perpendicularly aligned to the first line-space resist pattern to form bitlines that are self-aligned to the bitline contacts.

17 Claims, 3 Drawing Sheets

FOR MOL INTEGRATION

FIELD OF THE INVENTION

The present invention relates to semiconductor device manufacturing, and more particularly to a method of fabricating a metal oxide semiconductor field effect transistor (MOSFET) containing structure in which the bitline contacts are self-aligned to the bitlines, and both the bitlines and bitline contacts are fabricated using line-space resist patterns.

BACKGROUND OF THE INVENTION

In the field of semiconductor device manufacturing, it is well known to couple one area of the device to another area of the device through bitlines and bitline contacts. The bitline contacts are typically formed between MOSFETs in the array device regions and they are configured in such a manner that one end of the bitline contact is in electrical contact with a diffusion region formed in the substrate and the other end of the bitline contact is in electrical contact with the bitline. The bitline, on the other hand, is used to provide electrical contact with other device regions present in the structure, or alternatively, with other devices which are external to the semiconductor device.

Typically, prior art bitlines and bitline contacts are formed utilizing two separate and distinct masking steps.

The first masking step forms the bitline contact between MOSFETs, while a separate and distinct masking step is used in defining the region in which the bitline will be formed. The use of prior art methods for fabricating bitlines and bitline contacts adds extra processing steps and costs to the overall manufacturing process.

Moreover, prior art methods of separately preparing bitlines and bitline contacts do not provide a semiconductor structure in which the bitline contact is significantly self-aligned to the bitline. Instead, the separate masking steps may cause a slight misalignment between the bitline and bitline contact. This slight misalignment provided by prior art methods may lead to increased parasitic capacitance, noise and eventually device failures.

in view of the above problems with prior art processes of separately forming bitlines and bitline contacts, there is a continued need for providing a new and improved method in which the bitlines and bitline contacts can be fabricated from a single masking process in which linespace patterns are used in defining both the bitlines and the bitline contacts.

SUMMARY OF THE INVENTION

One object of the present invention is to provide a post gate stack processing scheme that is capable of forming bitline contacts that are self-aligned with the bitlines.

Another object of the present invention is to provide a post gate stack integration scheme in which the bitlines and the bitline contacts are fabricated utilizing a single masking process wherein only line-space resist patterns are employed.

These and other objects and advantages are achieved in the present invention by utilizing a method in which first and second line-space resist patterns are used in defining both the bitlines and bitline contacts. Proper alignment of the bitlines and bitline contacts is achieved in the present invention by forming the second line-space resist pattern perpendicular to the first line-space resist pattern.

Specifically, the method of the present invention, which achieves all of the above mentioned objects, comprises the steps of:

(a) providing a semiconductor structure having a plurality of patterned gate conductors formed on a surface of a gate dielectric, each of said patterned gate conductors including sidewall spacers formed thereon and being separated by a gap region, said gap region being filled with a dielectric material;

(b) forming an oxide cap layer on said dielectric material;

(c) forming a hard mask on said oxide cap layer;

(d) forming a first photoresist on said hard mask, said first photoresist having a first line-space pattern formed therein;

(e) etching through said first line-space pattern so as to pattern the hard mask and to partially remove said oxide cap layer;

(f) forming a second photoresist on said patterned hard mask, said second photoresist having a second line-space pattern formed therein which is perpendicular to said first line-space pattern, whereby a portion of said oxide cap layer between said first and second line-space patterns is exposed;

(g) etching through said exposed portion of said oxide cap layer so as to provide an opening to said gate dielectric in a device contact region;

(h) filling said opening with polysilicon;

(i) etching said polysilicon below a top surface of said oxide cap layer so as to form a recessed area in said opening; and (j) forming a bitline so as to contact said recessed area provided in step (i).

In one embodiment of the present invention, the oxide cap layer is not partially etched in step (e) above. Instead, in this embodiment, the oxide cap layer is partially removed following bitline contact formation. In another embodiment, the polysilicon employed in step (h) above is replaced with another conductive material such as a conductive metal, e.g., W, or a metallic silicide, e.g., $WSi_x$.

DETAILED DESCRIPTION OF THE INVENTION

Figure 1:
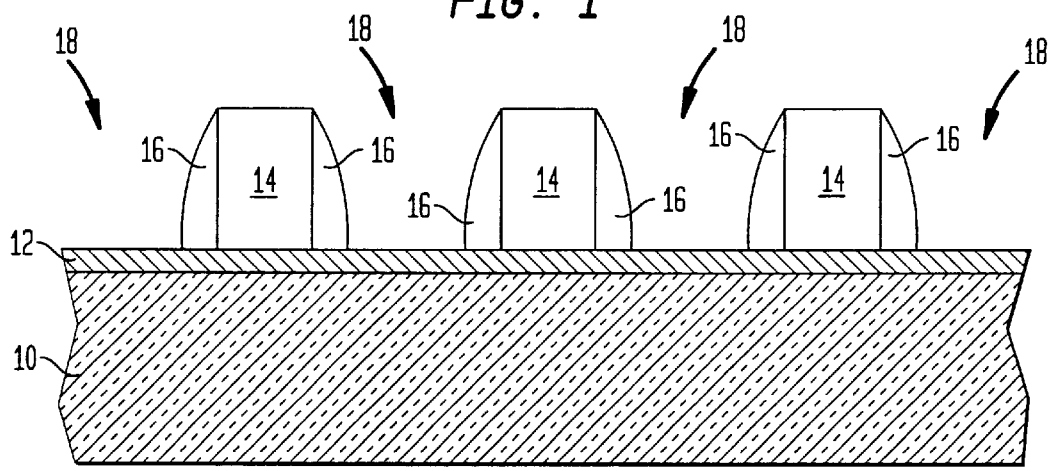
FIGS. 1, 2, 3A, 3B, 4, 5, 6, 7 and 8 are pictorial views illustrating the basic processing steps that are employed in the present invention in forming a self-aligned bitline contact to the bitline using only line-space resist patterns.

The present invention which provides a novel post gate stack processing scheme for fabricating bitlines and bitline contacts with a single masking process using only line-space resist patterns will now be described in more detail by referring to the drawings that accompany the present application. It should be noted that in the accompanying drawings like and/or corresponding elements are referred to by like reference numerals.

Reference is first made to FIG. 1 which shows an initial semiconductor structure that is employed in the present invention. Specifically, the structure shown in FIG. 1 comprises a semiconductor substrate 10 having a plurality of patterned gate conductors 14 formed on a surface of gate dielectric 12. As shown in the drawings, gate dielectric 12 is formed on a surface of the semiconductor substrate. Each patterned gate conductor includes sidewall spacers 16 that are formed on each side of the patterned gate conductor (See, FIG. 1) and each gate conductor is spaced apart from its neighboring gate conductor by gap region 18.

The structure shown in FIG. 1 is composed of conventional materials well known to those skilled in the art and any conventional gate stack processing scheme can be employed in fabricating the same. For example, substrate 10 employed in the present invention is composed of any semiconducting material, including, but not limited to: Si, Ge, SiGe, GaP, InAs, InP and all other III/V compound semiconductors. The substrate may also be composed of a layered semiconductor such as Si/SiGe, Si/SiO$_2$/Si or silicon-on insulators (SOIs). The substrate may be of the n or p-type depending on the type of device or devices to be fabricated. Moreover, the substrate may contain various isolation regions such as shallow trench isolation (STI) regions, LOCOS (local oxidation of silicon) regions or other like isolation regions either formed in the substrate or on a surface thereof.

The substrate may also include trench capacitors, such as deep trench capacitors. For clarity, the isolation regions and trench capacitors are not shown in the drawings of the present invention, but are nevertheless intended to be included within substrate 10.

Gate dielectric 12 is formed on a surface of substrate 10 utilizing a conventional deposition process such as chemical vapor deposition (CVD), plasma-assisted CVD, evaporation, or sputtering. Alternatively, the gate dielectric may be formed on the surface of substrate 10 utilizing a conventional thermal growing process. The gate dielectric is typically composed of an oxide such as SiO$_2$ and its thickness is not critical to the present invention.

Although not shown in the drawings, each patterned gate conductor, which is formed on gate dielectric 12, is composed of a gate stack comprising a doped polysilicon layer and a conductive metal or metallic silicide layer. An optional barrier layer comprising TiN or TaN, for example, may be formed between the doped polysilicon and the conductive metal or metallic silicide. Each patterned gate conductor also includes a silicon nitride cap which is formed on a top surface of the conductive metal or metallic silicide layer.

The patterned gate conductor stack is formed by utilizing any conventional gate processing scheme known to one skilled in the art including: conventional deposition techniques such as chemical vapor deposition (CVD), plasma-enhanced CVD, plating, evaporation, sputtering, reactive sputtering, and etc. are employed in forming the individual layers of the gate conductor stack; a conventional silicidation process; conventional planarization processes such as chemical-mechanical polishing (CMP) or grinding; and conventional lithography and etching including reactive-ion etching (RIE) and other like dry etching processes. The lithography and etching steps are used in forming the patterned gate conductor in the gate stack. It is noted that each individual layer of the gate stack may be formed utilizing the same or different deposition process.

Sidewall spacers 16 are formed by conventional techniques well known to those skilled in the art including deposition of silicon nitride and etching the deposited silicon nitride so as to form spacers on the sidewalls of the patterned gate conductor. The spacers may also be formed by a directional deposition process.

Following formation of the sidewall spacers on the patterned gate conductors, diffusion regions including source/drain diffusions, V$_T$ implants, halo implants and/or source/drain extensions may be formed in the structure utilizing conventional ion implantation processes well known to those skilled in the art. It is also within the contemplation of the present invention to omit the implant steps until after the bitline opening is formed in the structure.

Figure 2:
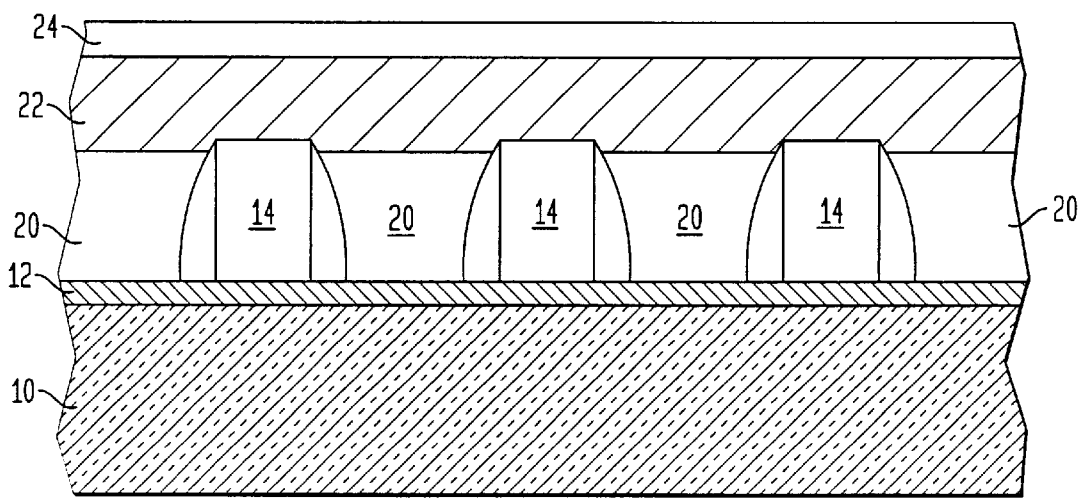

FIG. 2 illustrates the structure that is obtained after forming dielectric material 20 in gap region 18, forming oxide cap layer 22 on the dielectric material, and forming hard mask 24 on the oxide cap layer. Specifically, the structure shown in FIG. 2 is formed by first depositing a dielectric material on the structure of FIG. 1 to at least partially fill gap regions 18. Any conventional deposition process such as CVD, plasmaenhanced CVD, evaporation, spin-on coating, sputtering and other like deposition processes is used in forming the dielectric material which is composed of any doped dielectric material such as, but not limited to: boron phosphorus silicate glass (BPSG), arsenic silicate glass (ASG) or boron silicate glass. An optional planarization and/or a recess process may follow the deposition of the dielectric material. In another optional embodiment of the present invention, the dopant present in dielectric material 20 may be driven into the substrate using any conventional annealing process that is capable of driving in the dopant and activating the same.

Next, oxide cap layer 22 which may be formed of SiO$_2$ or an oxynitride such as SiO$_x$N$_y$ is formed on dielectric material 20 utilizing any conventional deposition process such as CVD, plasma-enhanced CVD, spin-on coating, evaporation and other like deposition processes. A preferred oxide cap material is tetraethylorthosilicate (TEOS) that is formed by a CVD process.

The hard mask, which may be composed of SiN, spun-on glass, a metal or an anti-reflective coating, is then formed on the oxide cap layer utilizing any conventional deposition process such as plasma-enhanced CVD, spin-on coating, evaporation or sputtering.

The individual thicknesses of each of layers 20, 22 and 24 is not critical to the present invention and any thickness of these layers which are typically employed in the art can be used in the present invention.

Figure 3A:
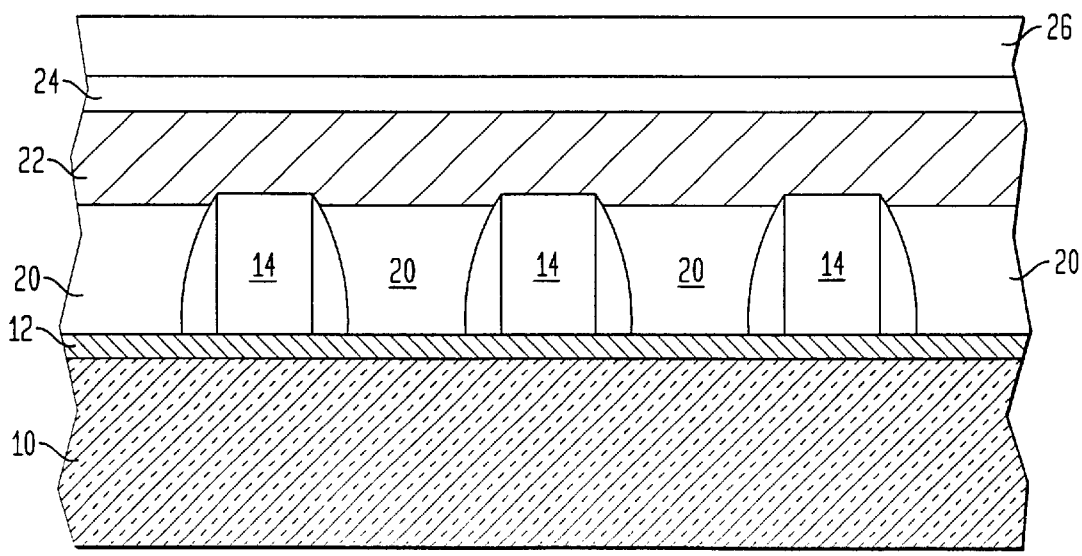
Figure 3B:
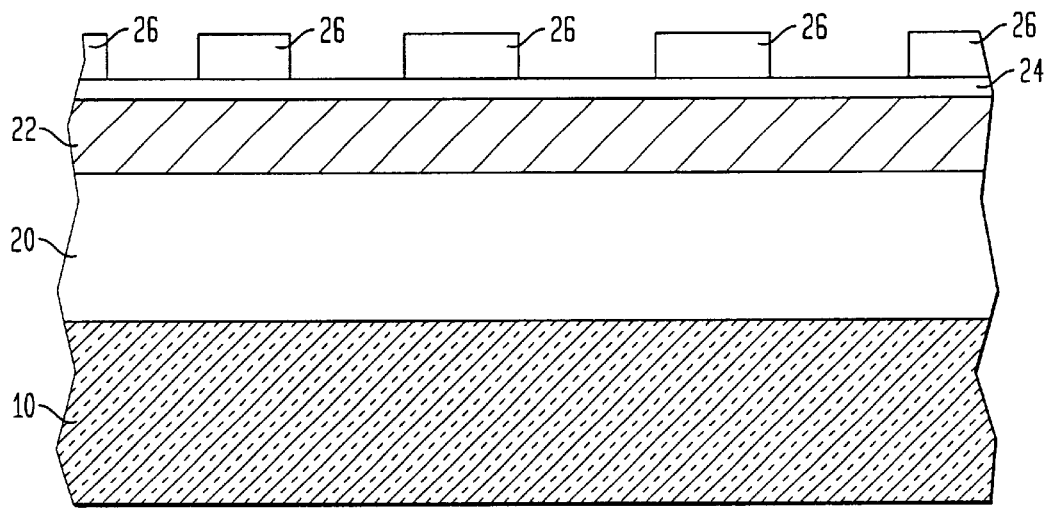

A conventional photoresist is then formed on the top surface of hard mask 24 and thereafter a first line-space resist pattern is formed in the photoresist by utilizing conventional lithography including resist exposure and development. The structure containing the patterned photoresist is shown in FIGS. 3A–3B, wherein reference numeral 26 is used in illustrating the patterned resist. It is noted that the view depicted in FIG. 3A shows only a line patterned photoresist (the spaces and adjacent lines are hidden from this view), while the view in FIG. 3B illustrates both the line and space pattern.

Next, with patterned photoresist 26 in place, an etching step is performed so as to transfer the line and space resist pattern to hard mask 24. It is noted that this etching step also partially removes a portion of the oxide cap layer which is located in the areas of the structure wherein the space pattern is present. The structure, after the above etching step has been performed, is illustrated in FIG. 4.

In one embodiment of the present invention, which is not illustrated in the drawings, the oxide cap layer is not partially removed during the above etching step. Instead, when such an embodiment is performed, the oxide cap layer may be partially removed following bitline contact formation.

Figure 4:
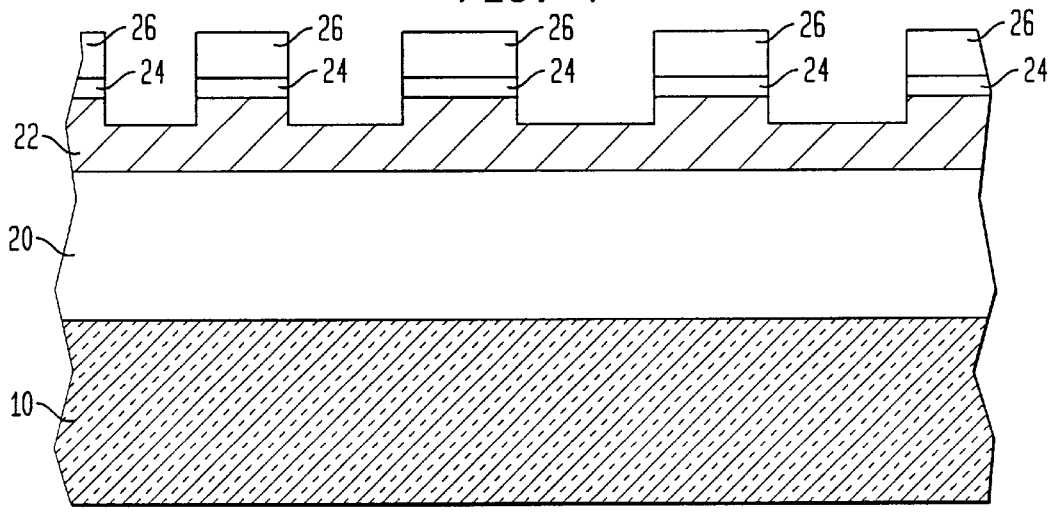

The etching employed in providing the structure shown in FIG. 4 is carried out utilizing any conventional dry etching process such as RIE, ion-beam etching, plasma-etching or other like etching process that is capable of opening the hard mask and thus transferring the line and space pattern to the hard mask.

Following the transfer of the resist line-space pattern the hard mask, the photoresist employed in defining the same is stripped from the structure utilizing a conventional stripping process well known to those skilled in the art.

Figure 5:
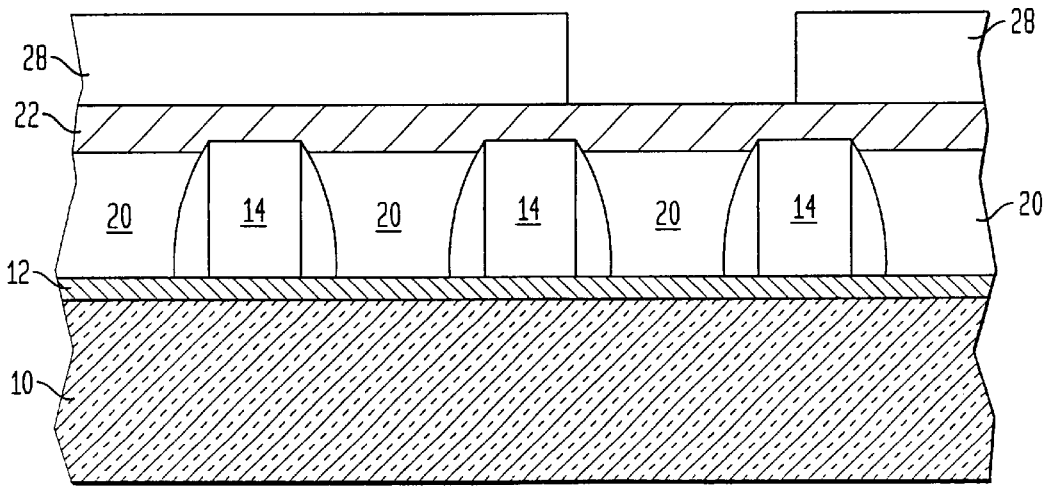

Next, as shown in FIG. 5, a second photoresist is formed on the hard mask containing the first line-space pattern by conventional deposition processes such as CVD or spinon coating, and conventional lithography (e.g., resist exposure and development) is employed in defining a second line-space resist pattern in the structure; in FIG. 5, the patterned photoresist is designated by reference numeral 28. In accordance with the present invention, the second line-space resist pattern is formed perpendicular to the first line-space resist pattern so that a portion of oxide cap layer 22 is exposed.

It should be noted that the first and second line-space resist patterns form a checker board configuration on the structure wherein alternating blocks of the structure are blocked with resist and/or hard mask. Specifically, by utilizing the first and second line-space patterns in the manner described above, it is possible to form an opening in the structure which limits the bitline contacts. That opening defines where the oxide is etched through to the active areas present in the semiconductor substrate.

Figure 6:
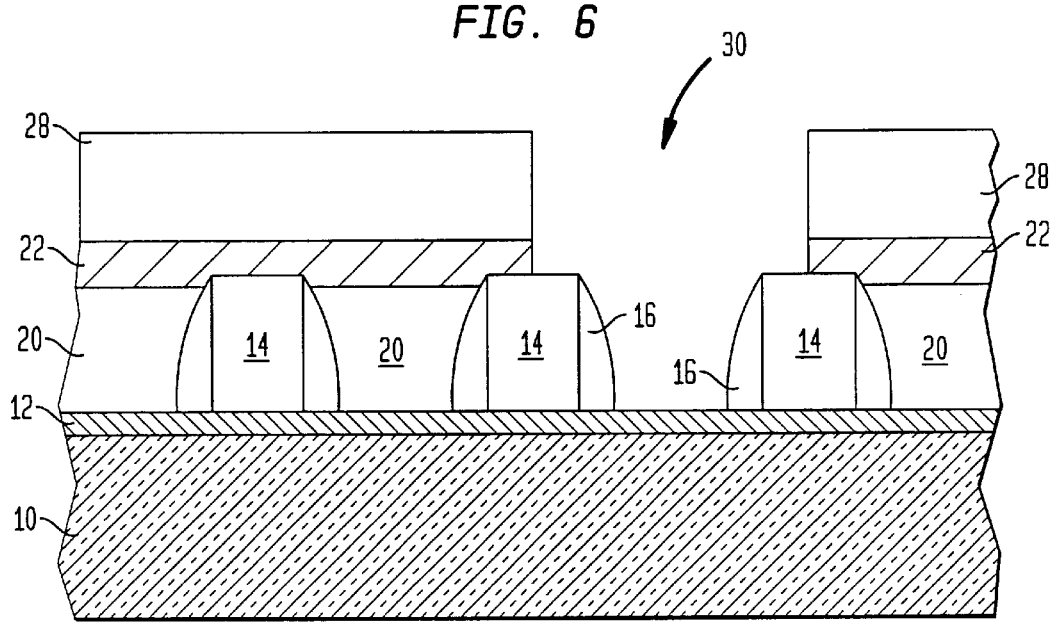

FIG. 6 illustrates the structure that is formed after etching through the second line-space resist pattern forming opening 30 to the gate dielectric layer. The etching process utilized in this step of the present invention is a self-aligned bitline contact etch which includes the use of any directional oxide etching process such as RIE that is capable of selectively etching oxide, silicon nitride and dielectric 20. Although only one opening is depicted in the drawings of the present application, a plurality of such openings may also be formed therein.

Following this second etching step, the resist containing the second line-space pattern is removed utilizing a conventional stripping process well known to those skilled in the art.

Figure 7:
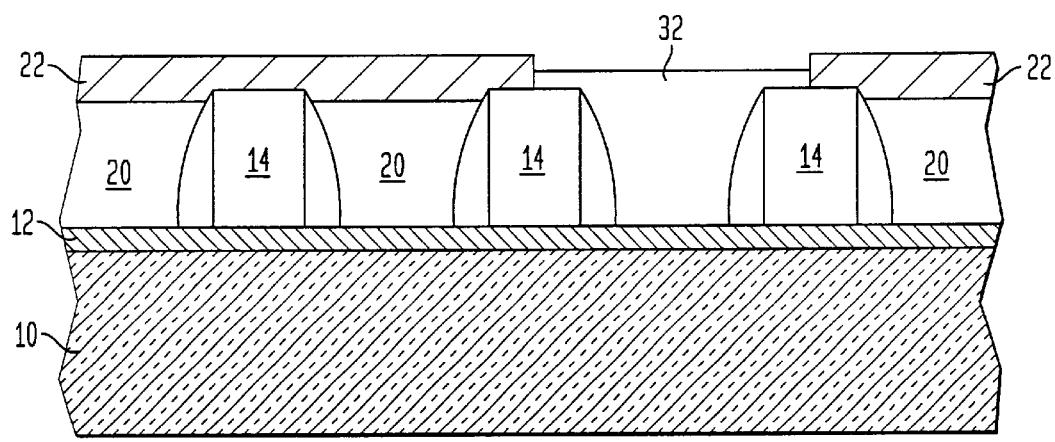

FIG. 7 illustrates the structure that is formed after polysilicon 32 has been deposited into the opening and a conventional recessing step has been performed. Specifically, the opening provided by the first and second line-space patterns is filled with polysilicon utilizing a conventional deposition process such as CVD, plasma-enhanced CVD, sputtering, reactive-sputtering, evaporation, chemical solution deposition, and other like deposition processes. Recessing, which is conducted to slightly below the oxide cap layer, is carried out utilizing a conventional dry and/or wet etch process that is selective in removing polysilicon as compared to oxide. It is noted that recessed polysilicon 32 is the bitline contact of the structure.

It should be noted that instead of polysilicon the present invention also contemplates the use of other conductive materials such as conductive metals and metallic silicides as the bitline contact material. These other bitline contact materials may be the same or different than the conductive materials used in forming the bitline.

Figure 8:
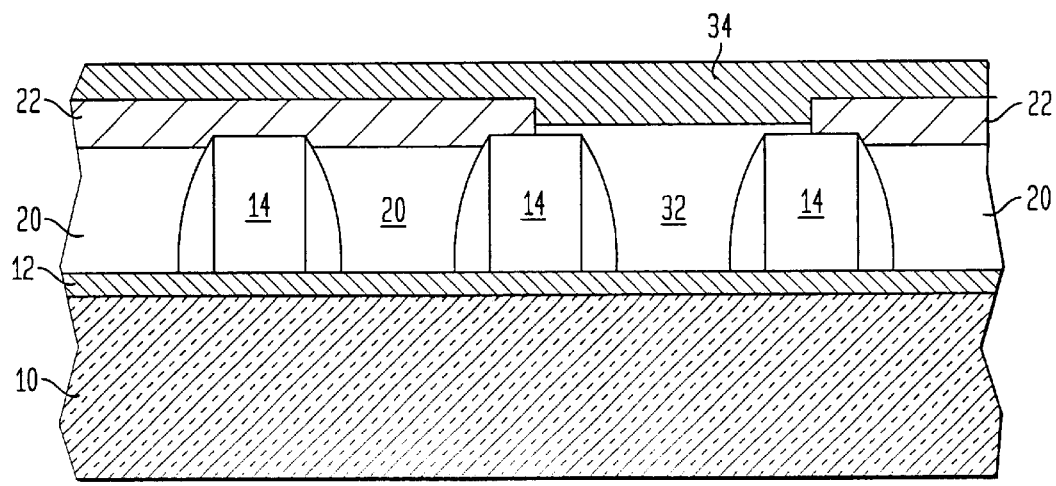

FIG. 8 illustrates the structure that is formed after forming bitline 34 which contacts the recessed bitline contact. The bitline may be formed utilizing any well known technique that is capable of forming a bitline.

The following description describes a preferred method in which the bitline is formed in the structure. It should be noted that although description is given for this preferred embodiment, the invention is not limited thereto. Specifically, bitline 34 can be formed by first removing, via a selective etching process, a portion of the oxide cap layer so as to form troughs therein for bitline deposition. This etch, which is performed in the presence of the patterned hard mask, is carried out utilizing any etching process that is highly selective for removing oxide as compared to nitride hard mask. It should be noted that during this etching process the oxide cap layer is thinned.

A Ti film (or other like adhesion material) is formed in the etched trough by ionized plasma vapor deposition or directional sputtering and thereafter a TiN barrier (or other like barrier material) is deposited on the Ti film by CVD. W (or other like conductive metal, i.e., Cu, Pt, Ag or Au), is then deposited on the TiN barrier so as to form a bitline that is in contact with recessed polysilicon 32, See FIG. 8. In place of the conductive metal, the present invention also contemplates that the bitline may be composed of a metallic silicide such as $WSi_x$ that is formed utilizing a conventional silicide process.

The structure containing the conductive metal may then be optionally planarized utilizing CMP or grinding so as to provide a planar structure, wherein the Ti film, TiN barrier and W metal are all confined within the recessed area. It should be noted that in FIG. 8, bitline 34 is used to denote the Ti film, TiN barrier and the W metal.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a semiconductor device including MOSFETs, bitlines and bitline contacts, wherein said bitline contacts are self-aligned to said bitlines, said method comprising the steps of:
   (a) providing a semiconductor structure having a plurality of patterned gate conductors formed on a surface of a gate dielectric, each of said patterned gate conductors including sidewall spacers formed thereon and being separated by a gap region, said gap region being filled with a dielectric material;
   (b) forming an oxide cap layer on said dielectric material;
   (c) forming a hard mask on said oxide cap layer;
   (d) forming a first photoresist on said hard mask, said first photoresist having a first line-space pattern formed therein;
   (e) etching through said first line-space pattern so as to pattern the hard mask and to partially remove said oxide cap layer;
   (f) forming a second photoresist on said patterned hard mask, said second photoresist having a second line-space pattern formed therein which is perpendicular to said first line-space pattern, whereby a portion of said oxide cap layer between said first and second line-space patterns is exposed;
   (g) etching through said exposed portion of said oxide cap layer so as to provide an opening to said gate dielectric in a device contact region;
   (h) filling said opening with polysilicon;
   (i) etching said polysilicon below a top surface of said oxide cap layer so as to form a recessed area in said opening; and
   (j) forming a bitline so as to contact said recessed area provided in step (i).

2. The method of claim 1 wherein step (a) includes a gate stack processing scheme.

3. The method of claim 2 wherein said gate stack processing scheme includes depositing a gate conductor stack on the surface of said gate dielectric and patterning the gate stack by lithography and etching.

4. The method of claim 3 wherein said gate conductor stack includes a layer of doped polysilicon, a conductive metal or metallic silicide on said doped polysilicon and a silicon nitride cap formed on said metal or metallic silicide.

5. The method of claim 1 wherein said spacers are formed by deposition and etching.

6. The method of claim 1 wherein said dielectric material, oxide cap and hard mask are formed by the same or different deposition process selected from the group consisting of CVD, plasma-enhanced CVD, sputtering, reactive-sputtering, spin-on coating and evaporation.

7. The method of claim 1 wherein step (d) includes resist exposure and development.

8. The method of claim 1 wherein step (e) includes a dry etching process selected from the group consisting of RIE, ion-beam etching and plasma etching.

9. The method of claim 1 further comprising removing the first photoresist after step (e).

10. The method of claim 1 wherein step (f) includes resist exposure and development.

11. The method of claim 1 wherein step (g) includes a directional etching process.

12. The method of claim 1 wherein said second photoresist is removed after step (g).

13. The method of claim 1 wherein step (h) includes a deposition process selected from the group consisting of CVD, plasm-enhanced CVD, sputtering, reactive sputtering, evaporation and chemical solution deposition.

14. The method of claim 1 wherein step (i) includes a dry or chemical wet etch process that is selective in removing polysilicon as compared to oxide.

15. The method of claim 1 wherein step (j) includes forming a trough in said oxide cap layer; filling said trough with an adhesion material; forming a barrier material on said adhesion material; forming a conductive metal or metallic silicide on said barrier material and planarizing the structure so as to obtain a bitline in said trough.

16. The method of claim 1 wherein during step (e) the oxide cap layer is not partially removed.

17. The method of claim 1 wherein said polysilicon used in step (h) is replaced by a conductive metal or metallic silicide.

* * * * *